United States Patent

[11] 3,567,946

[72] Inventor Bernt Paul
Erlangen, Germany

[21] Appl. No. 861,354
[22] Filed Sept. 26, 1969
[45] Patented Mar. 2, 1971
[73] Assignee Siemens Aktiengesellschaft
Berlin, Germany
[32] Priority Sept. 27, 1968
[33] Germany
[31] P 17 89 046.9

[54] RADIATION DETECTOR HAVING SEMICONDUCTOR BODY EXHIBITING A PHOTOTHERMOMAGNETIC EFFECT
5 Claims, 4 Drawing Figs.

[52] U.S. Cl. 250/211, 136/89, 250/83.3, 317/235
[51] Int. Cl. H01j 39/12
[50] Field of Search 250/211, 212; 136/89; 317/235/27, 235/42

[56] References Cited

UNITED STATES PATENTS 3,226,225 8/1964 Weiss 250/211
3,408,499 10/1968 Weiss 250/211

OTHER REFERENCES

Kurnick et al. "Photoconductivity and Photoelectro magnetic Effects in InSb," Journal of Applied Physics; vol. 27, No. 3, March 1956, pp. 278 and 283.

*Primary Examiner*—Archie R. Borchelt
*Assistant Examiner*—C. M. Leedom
*Attorneys*—Curt M. Avery, Arthur E. Wilfond, Herbert L. Lerner and Daniel J. Tick

ABSTRACT: A layer of $SiO_x$ is provided on a surface of a semiconductor body of indium antimonide to which radiation is directed. $x$ is equal to or less than 2 and equal to or greater than 1. The indium antimonide has embedded needle-shaped inclusions of a metal which is of better electrical conductance characteristic than the indium antimonide. The inclusions are in mutually parallel alignment parallel to the direction of radiation to be detected and perpendicular to the direction of a magnetic field in which the semiconductor body is positioned. The semiconductor body exhibits a photothermomagnetic effect.

RADIATION DETECTOR HAVING SEMICONDUCTOR BODY EXHIBITING A PHOTOTHERMOMAGNETIC EFFECT

DESCRIPTION OF THE INVENTION

The invention relates to a radiation detector. More particularly, the invention relates to a radiation detector having a semiconductor body which exhibits a photothermomagnetic effect.

The semiconductor body is positioned within a magnetic field and comprises a semiconductor crystal of indium antimonide. Needle-shaped inclusions of a metal which is of better electrical conductance characteristic than the indium antimonide are embedded in said indium antimonide. The needle-shaped inclusions are in mutually parallel alignment, parallel to the direction of radiation to be detected and perpendicular to the direction of the magnetic field in which the semiconductor body is positioned.

German Pat. No. 1,214,807 and the corresponding U.S. Pat. No. 3,408,499 disclose a semiconductor photoelement which exhibits a photoelectromagnetic effect. The semiconductor body of the photoelement is provided with regions having a better electrical conductance characteristic, which regions are aligned substantially perpendicular to the direction of the current produced by the photoelectromagnetic effect. The better electrical conductance regions are thus also substantially perpendicular to the magnetic field required to produce the photoelectromagnetic effect. The better electrical conductance regions may comprise a metal of better electrical conductance characteristic than the semiconductor body and may be aligned substantially parallel to the impinging radiation.

It has been found unexpectedly that the sensitivity of semiconductor photoelements of the aforedescribed type, at higher wavelengths, is not limited by the absorption edge of the semiconductor material, i.e. the semiconductor material without inclusions of better electrical conductance characteristic. Such semiconductor photoelements are also sensitive to radiation having wavelengths in the long wavelength range beyond the absorption edge of the semiconductor material. It has therefore been proposed such as, for example, in German Pat. application Ser. No. P 16 14 570,3, that such semiconductor photoelements be utilized as receivers for radiation having wavelengths in the long wavelength range beyond the absorption edge of the semiconductor material of the semiconductor photoelement.

The sensitivity to radiation of wavelengths in the long wave range beyond the absorption edge of the semiconductor material is due to the fact that a photothermomagnetic effect replaces the photoelectromagnetic effect when the wavelength is in such a long wavelength range. The photothermomagnetic effect is due to the fact that the effect of the radiation causes a temperature gradient to develop within the semiconductor body. The temperature gradient, which is in the direction of the radiation, acts upon the semiconductor body together with the magnetic field and produces a Nernst-Ettinghausen voltage at the semiconductor body. The temperature gradient is a result of the fact that in the semiconductor body, when subjected to radiation, heat is produced by radiation absorption. The heat decreases as the distance from the semiconductor surface upon which the radiation impinges increases. The Nernst-Ettinghausen voltage produced in the semiconductor body is proportional to the magnitude of the temperature gradient, and is thus also proportional to the absorbed radiation output.

A radiation detector having a semiconductor body comprising indium antimonide having embedded needle-type inclusions of a metal which is of better electrical conductance characteristic is well suited for detecting radiation of wavelengths equal to or greater than 8 microns. Such wavelengths are in the long wavelength range, beyond the absorption edge of the indium antimonide, since this absorption edge is situated at a wavelength of approximately 7.2 microns.

The principal object of my invention is to provide a new and improved radiation detector.

An object of the invention is to provide a radiation detector of increased sensitivity in the higher wavelength range.

An object of the invention is to provide a radiation detector of increased sensitivity in the wavelength range of 8 to 12 microns.

An object of my invention is to provide a radiation detector utilizing a semiconductor body exhibiting a photothermomagnetic effect, which functions with efficiency, effectiveness and reliability.

In accordance with the invention, the surface of the semiconductor body of the radiation detector upon which radiation impinges, is covered with a layer of $SiO_x$, wherein $$1 \leq x \leq 2.$$

In accordance with my invention, a radiation detector for detecting radiation directed thereto comprises means for producing a magnetic field. A semiconductor body exhibiting a photothermomagnetic effect is positioned in the magnetic field. The semiconductor body comprises a semiconductor crystal of indium antimonide having embedded needle-shaped inclusions of a metal which is of better electrical conductance characteristic than the semiconductor crystal. The needle-shaped inclusions are in mutually parallel alignment parallel to the direction of radiation to be detected and perpendicular to the direction of the magnetic field. A layer of $SiO_x$ is provided on the surface of the semiconductor body to which radiation is directed. $x$ is equal to or less than 2 and equal to or greater than 1. An electrical indicator electrically connected to the semiconductor body indicates a variation in electrical characteristic thereof.

The $SiO_x$ layer is preferably at least 1 micron thick. The oxygen content of the $SiO_x$ layer may vary across the thickness of such layer. The maximum thickness of the $SiO_x$ layer is preferably one-tenth the thickness of the semiconductor crystal. The needle-shaped inclusions may comprise nickel antimonide and form a eutectic with the indium antimonide.

In order that the invention may be readily carried into effect, it will now be described with reference to the accompanying drawing, wherein.

Figures 1, 2, 4:
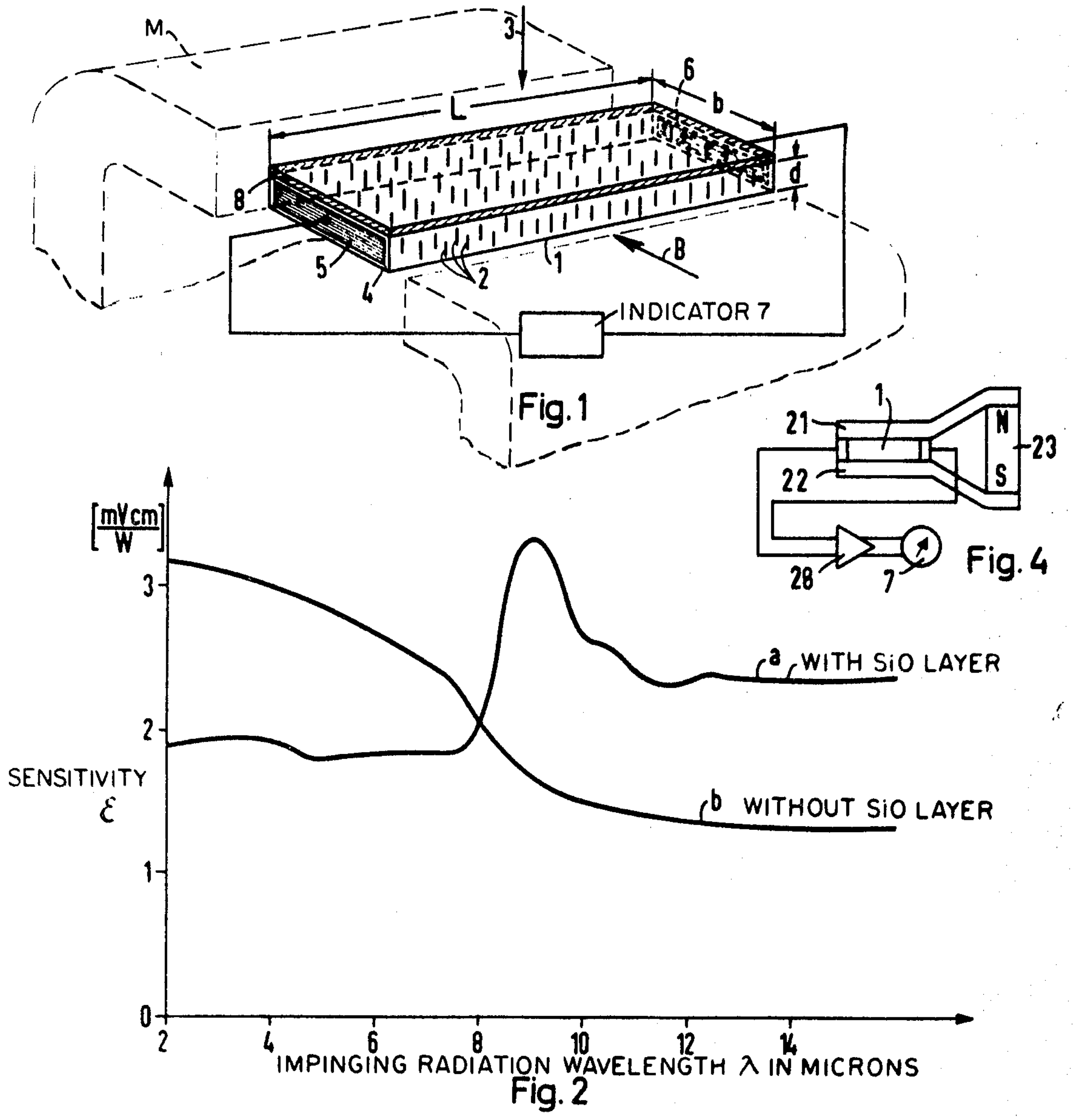
FIG. 1 is a schematic perspective diagram of an embodiment of the radiation detector of the invention.
FIG. 2 is a graphical presentation illustrating the spectral sensitivity of the radiation detector of the invention and the spectral sensitivity of a radiation detector lacking a $SiO_x$ layer.
FIG. 4 is a schematic diagram of the complete radiation detector of the invention.

In accordance with the present invention, the surface of the semiconductor body of the radiation detector upon which the radiation to be detected impinges is covered with a $SiO_x$ layer. $x$ is greater than or equal to 1 and less than or equal to 2. The utilization of the $SiO_x$ layer permits a portion of the impinging radiation to be absorbed in said layer, so that at the same intensity of said impinging radiation the temperature at the surface of the semiconductor crystal increases and the temperature gradient in the semiconductor crystal becomes greater than in a semiconductor crystal without a $SiO_x$ layer. The greater temperature gradient results in a higher Nernst-Ettinghausen voltage at the semiconductor crystal. The higher Nernst-Ettinghausen voltage results in an increased sensitivity of the radiation detector.

The wavelength range between 8 and 12 microns is particularly important from the technical point of view, since the radiation of a $CO_2$ laser, which is the laser of greatest energy and has a wavelength of 10.6 microns, falls within such range. The radiation detector of my invention is thus particularly suitable as a detector for the radiation of a $CO_2$ laser. The radiation detector of the invention is also well suited as a detector of infrared heat radiation in the same wavelength range emitted by objects having surface temperatures between approximately −20° C. and +100° C. Such objects are primarily living organisms having body temperatures within such temperature range. The radiation detector of my invention has an advantage of operating at room temperature.

To produce a greater temperature gradient in the semiconductor crystal it is expedient to heat, as much as possible, the surface of the semiconductor crystal upon which the radiation to be detected impinges. It is thus advantageous that the $SiO_x$ layer absorbs an essential part of the penetrating radiation. The $SiO_x$ layer should therefore preferably have a thickness which is as great as the depth of penetration of the radiation, within the wavelength range of the absorption maximum of such layer. The depth of penetration or penetration depth is defined as the reciprocal absorption constant. When the thickness of the $SiO_x$ layer equals the depth of penetration of the radiation, approximately 63 percent of the penetrating radiation is absorbed in said layer.

Increased absorption may be provided by increasing the thickness of the $SiO_x$ layer. Thus, when the thickness of the $SiO_x$ layer is twice the depth of penetration of the radiation, 86.5 percent of the penetrating radiation is absorbed in said layer. However, since the absorption limit of the $SiO_x$ layer depends upon the wavelength of the radiation and the composition of said layer, it is impossible to determine a magnitude for the depth of penetration which is applicable to all wavelengths and layer compositions.

When the $SiO_x$ layer is $SiO_2$ having a thickness of 1 micron, the depth of penetration is exceeded by the thickness of the layer in the wavelength range of 8 to 9.6 microns. When the $SiO_x$ layer is SiO having a thickness of one micron, the depth of penetration is exceeded within the wavelengths ranging from 9 to 10.6 microns. The $SiO_x$ layer should therefore preferably be at least one micron in thickness.

The $SiO_x$ layer should not be too thick, since a layer which is too thick has a relatively high heat capacity and therefore absorbs too much heat before the temperature can increase at the surface of the semiconductor crystal at which the radiation impinges. This would decrease the sensitivity of the radiation detector. In order to avoid this effect, the maximum thickness of the $SiO_x$ layer should be one-tenth the thickness of the semiconductor crystal. The thickness of the semiconductor crystal is intended to mean the dimension of the crystal in the direction of the impinging radiation.

Since the absorption maximum of the $SiO_x$ layer is within somewhat different wavelengths, depending upon the oxygen content, the wavelength range of the maximum absorption may be shifted by special selection of the composition of the $SiO_x$ layer. The absorption maximum of a SiO layer is, for example, within a wavelength of about 10 whereas the absorption maximum of a $SiO_2$ layer is within a wavelength of about 9 microns. The sensitivity of the radiation detector sill be especially high within the range of the absorption maximum of the $SiO_x$ layer. This sensitivity is increased, however, regardless of the special composition of the $SiO_x$ layer, in the entire wavelength range between 8 and 12 microns, as compared to a radiation detector which does not have a $SiO_x$ layer.

In order to obtain a particularly wide absorption maximum and thus obtain a very high sensitivity over a wide range of wavelengths, the $SiO_x$ layer may be favorably developed in a manner whereby the oxygen content varies across the thickness of said layer.

The radiation receiver of the invention preferably utilizes an indium antimonide crystal having needle-shaped inclusions of nickel antimonide which form a eutectic with the indium antimonide. By unidirectional solidification (normal freezing) or zone melting of indium antimonide with nickel antimonide of 1.8 percent by weight, a eutectic is formed whereby the nickel antimonide precipitates in the form of mutually parallel needles. The needles are approximately 10 to 100 microns, preferably about 30 microns in length and about 0.5 micron in diameter. The lateral space between the individual needles is approximately 3.5 microns. The absorption constant of the material is within a wave range of 8 to 12 microns, at approximately 200 $cm^{-1}$. The Nernst-Ettinghausen coefficient of the material is higher by a factor of approximately 20 than the Nernst-Ettinghausen coefficient of intrinsic conducting indium antimonide without needles.

Other suitable materials for the semiconductor crystal of the radiation receiver of my invention are indium antimonide crystals having inclusions of manganese antimonide or iron antimonide forming a eutectic with the indium antimonide. The semiconductor crystals and the method of production of such crystals are described in detail in an article on pages 2021 to 2028 of The Journal of Physics and Chemistry of Solids, Vol. 26, 1965.

In the radiation detector of FIG. 1, the semiconductor crystal 1 comprises indium antimonide having embedded needle-shaped inclusions 2 of nickel antimonide. The semiconductor crystal is positioned so that the inclusions 2 are aligned substantially parallel to the direction of radiation 3 which is to be detected. The inclusions 2 are perpendicular to the direction of a magnetic field B within which the semiconductor crystal 1 is positioned. The magnetic field is provided by any suitable magnet such as, for example, a permanent magnet M, indicated in broken lines in order to maintain the clarity of illustration. The semiconductor crystal 1 is positioned between the pole pieces of the permanent magnet M.

An end surface 4 of the semiconductor crystal 1 has an electrode 5 affixed thereto and an opposite end surface 4′ has an electrode 6 affixed thereto. The electrodes 5 and 6 provide an electrical voltage or current which occurs as a result of the photothermomagnetic effect and apply said voltage or current to a suitable indicating instrument 7. The indicating instrument 7 may comprise any suitable voltage or current indicator such as, for example, an oscillograph, voltmeter or meter. In accordance with the invention, a SiO layer 8 is provided on the surface of the semiconductor crystal 1 upon which the radiation 3 is to impinge. It is preferred to provide the SiO layer 8 on the purified surface of the semiconductor crystal by vapor deposition in a high vacuum.

The semiconductor crystal 1 has a thickness $d$ of a magnitude which is such that the radiation which is passed by the SiO layer 8 is absorbed primarily within the semiconductor body. An indium antimonide semiconductor body having nickel antimonide needles and a thickness $d$ of 0.01 cm, a width $b$ of 0.05 cm, a length L of 0.6 cm, a SiO layer having a thickness of about 2.5 microns, and operated in a magnetic field B of about 9 kilogauss, was found to be very suitable as a radiation detector in a wavelength range between 8 and 12 microns.

The electric field intensity produced in the semiconductor crystal 1 by the photothermomagnetic effect depends, when the radiation intensity is constant, upon the magnetic field, the thickness of said semiconductor crystal, the wavelength, and the modulation frequency of the radiation. The radiation detector of the invention preferably utilizes a magnetic field of about 7 to 10 kilogauss and a crystal having a thickness of about 0.01 cm. In FIG. 2, the abscissa indicates the wavelength $\lambda$ of the impinging radiation in microns and the ordinate indicates the sensitivity $\epsilon$ in $mVcm/w$. The curve $a$ of FIG. 2 indicates the sensitivity of a radiation detector having an indium antimonide crystal with nickel antimonide inclusions, a thickness of about 0.01 cm and a magnetic field of 9 kilogauss at room temperature of approximately 298° K. The radiation detector of curve $a$ has a SiO layer. The curve $b$ of FIG. 2 indicates the sensitivity of a radiation detector of similar type to that of curve $a$, but without a SiO layer.

In FIG. 2, $\epsilon$ is the quotient of the electric field intensity, effective between the electrodes 5 and 6 of the semiconductor crystal 1, and the radiation intensity. The radiation intensity is dimensions as $Wcm^{-2}$ and is defined as the quotient of the radiation output impinging upon the semiconductor crystal 1 and the surface of said semiconductor crystal.

FIG. 2 clearly illustrates that the sensitivity of the radiation detector is considerably increased by the SiO layer in the wavelength range between 8 and 12 microns. The absorption within the SiO layer produces an increase in the sensitivity of the radiation detector, even in a range of greater wavelengths. The radiation which resulted in the curves *a* and *b* of FIG. 2 was modulated by a frequency of 13 Hertz. This was achieved by chopping with a rotary shutter.

In order to further illustrate the increase in sensitivity resulting from the use of the SiO layer, Table I shown the no-load voltage $V_L$ which occurs between the contacts or electrodes of the semiconductor crystals at a radiation intensity of 1 $Wcm^{-2}$ and a wavelength of 10 microns. The semiconductor crystals have different surfaces F upon which the radiation impinges. The semiconductor crystals utilized to provide the data for Table I were about 0.01 cm in thickness and were positioned in a magnetic field of 9 kilogauss. The thickness of the SiO layer of the semiconductor crystal having such layer was 2 to 2.5 microns.

Table I

| | No-load voltage $V_L$ in mV | |
|---|---|---|
| Surface F in $mm^2$ | With SiO layer | Without SiO layer |
| 0.7× 10 | 2.6 | 1.4 |
| 0.5× 6 | 1.6 | 0.84 |
| 0.5× 0.5 | 0.13 | 0.07 |

Figure 3:
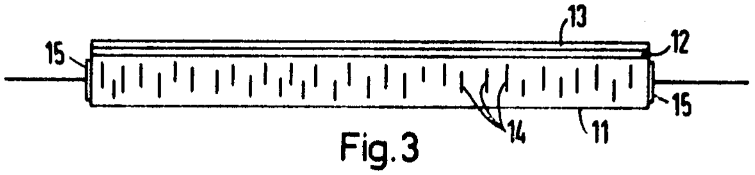
FIG. 3 is a schematic diagram of another embodiment of the radiation detector of the invention.

The embodiment of the radiation detector of FIG. 3 comprises a semiconductor crystal 11 having a surface upon which the radiation is to impinge covered by a layer 12 of $SiO_2$. The layer 12 of $SiO_2$ is in turn covered with a layer 13 of SiO. The oxygen content varies across the thickness of the $SiO_x$ layer 12, 13. The needle-shaped inclusions are indicated as 14 and the vapor-deposited contacts or electrodes are indicated as 15 and 15'. Each of the $SiO_2$ layer 12 and the SiO layer 13 has a thickness of about 1 to 2 microns.

In order to apply the $SiO_2$ layer, SiO may be vapor-deposited in an oxygen atmosphere, for example upon the purified surface of the semiconductor crystal, or a SiO layer may first be vapor-deposited, in vacuum, and subsequently oxidized into $SiO_2$. The SiO layer may then be vapor-deposited on the $SiO_2$ layer, in high vacuum.

During the measurement of radiation temperatures of objects having low temperatures, the radiation output impinging upon the semiconductor crystal is frequently in the range of microwatts. The no-load voltage provided by the radiation detector is in the nanovolt range. A chopper operation is preferable for measuring the voltage at these magnitudes. The radiation to be recorded is chopped, for example, with a toothed wheel, moving mirror or tuning fork chopper. The radiation detector then produces an AC voltage signal which may be supplied, for example, to a resonance amplifier. This type of resonance amplifier may be provided by connecting in series circuit arrangement an input transformer, a wideband amplifier having a low noise input stage, a phase-controlled rectifier and a time constant member.

Adequate radiation output is frequently available, on the other hand, when laser beams are detected, so that the radiation detector may be connected directly to the input of an oscillograph amplifier, for example. This is shown in FIG. 4, wherein the semiconductor crystal 1 is positioned in the magnetic field of a magnet 21, 22, 23. The signal produced by the semiconductor crystal 1 is supplied to an amplifier 28, which amplifies said signal and supplies it to the appropriate indicator or meter 7.

The time constant of the radiation detector is extremely low for a thermal detector. For a semiconductor crystal thickness of 0.01 cm, in a wavelength range between 8 and 12 microns, the time constant is about 100 microsecond.

While the invention has been described by means of specific examples and in specific embodiments, I do not which to be limited thereto, for obvious modifications will occur to those skilled in the art without departing from the spirit and scope of the invention.

I claim:

1. A radiation detector for detecting radiation directed thereto, comprising:

means for producing a magnetic field;

a semiconductor body exhibiting a photothermomagnetic effect positioned in said magnetic field, said semiconductor body comprising a semiconductor crystal of indium antimonide having embedded needle-shaped inclusions of a metal which is of better electrical conductance characteristic than said semiconductor crystal, said needle-shaped inclusions being in mutually parallel alignment parallel to the direction of radiation to be detected and perpendicular to the direction of said magnetic field;

a layer of $SiO_x$ on a surface of said semiconductor body to which radiation is directed, *x* being equal to or less than 2 and equal to or greater than 1; and electrical indicating means electrically connected to said semiconductor body for indicating a variation in electrical characteristic thereof.

2. A radiation detector as claimed in claim 1, wherein the $SiO_x$ layer is at least 1 micron thick.

3. A radiation detector as claimed in claim 1, wherein the oxygen content of the $SiO_x$ layer varies across the thickness of said layer.

4. A radiation detector as claimed in claim 1, wherein the maximum thickness of the $SiO_x$ layer is one-tenth the thickness of the semiconductor crystal.

5. A radiation detector as claimed in claim 1, wherein the needle-shaped inclusions comprise nickel antimonide and form a eutectic with the indium antimonide.